(12) United States Patent
Miyazawa

(10) Patent No.: US 11,817,853 B2
(45) Date of Patent: Nov. 14, 2023

(54) SEMICONDUCTOR MODULE

(71) Applicant: FUJI ELECTRIC CO., LTD., Kawasaki (JP)

(72) Inventor: Shigemi Miyazawa, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/846,670

(22) Filed: Jun. 22, 2022

(65) Prior Publication Data

US 2023/0063021 A1 Mar. 2, 2023

(30) Foreign Application Priority Data

Aug. 27, 2021 (JP) .................. 2021-139387

(51) Int. Cl.
*H03K 17/082* (2006.01)

(52) U.S. Cl.
CPC .................. *H03K 17/082* (2013.01)

(58) Field of Classification Search
None
See application file for complete search history.

(56) References Cited

U.S. PATENT DOCUMENTS

| | | | | |
|---|---|---|---|---|
| 4,760,434 A * | 7/1988 | Tsuzuki | .................. | H01L 23/34 257/470 |
| 4,893,158 A * | 1/1990 | Mihara | ............... | H01L 27/0251 257/341 |
| 5,079,608 A * | 1/1992 | Wodarczyk | ......... | H01L 29/7802 257/E29.257 |
| 5,227,655 A * | 7/1993 | Kayama | .............. | H01L 27/0688 257/E29.128 |
| 5,629,542 A * | 5/1997 | Sakamoto | .......... | H03K 17/0822 257/342 |
| 5,923,210 A * | 7/1999 | Le | ......................... | H03K 17/063 327/108 |
| 5,977,814 A * | 11/1999 | Ishii | ..................... | H03K 17/168 327/434 |
| 6,172,383 B1 * | 1/2001 | Williams | ......... | H03K 17/04123 257/341 |
| 6,930,870 B2 * | 8/2005 | Nobe | ................. | H03K 17/0822 361/103 |

(Continued)

FOREIGN PATENT DOCUMENTS

| JP | 2523678 B2 | 8/1996 |
|---|---|---|
| JP | 5940211 B2 | 6/2016 |

*Primary Examiner* — Thomas J. Hiltunen
*Assistant Examiner* — Khareem E Almo
(74) *Attorney, Agent, or Firm* — Rabin & Berdo, P.C.

(57) ABSTRACT

A semiconductor module including first and second transistors coupled in parallel to a first line receiving a power supply voltage, a driver circuit configured to apply, to a second line, a first voltage to turn on the first and second transistors in response to an input signal, a first resistor having two ends respectively coupled to the second line and a control electrode of the second transistor, a second resistor having two end respectively coupled to one of the two ends of the first resistor and a control electrode of the first transistor, a third resistor coupled to the second transistor, a third transistor coupled to one of the two ends of the second resistor, and a terminal coupled to the first to third transistors, the third resistor, and a load, such that the load receives a current from the first transistor.

6 Claims, 9 Drawing Sheets

(56) References Cited

U.S. PATENT DOCUMENTS

| | | | |
|---|---|---|---|
| 10,897,246 B2 * | 1/2021 | Scott | H03K 17/04123 |
| 2005/0286194 A1 * | 12/2005 | Fujiki | H01L 29/7804 |
| | | | 257/E29.136 |
| 2019/0190514 A1 * | 6/2019 | Ohashi | H03K 17/0828 |

* cited by examiner

SEMICONDUCTOR MODULE

CROSS-REFERENCE TO RELATED APPLICATION

The present application claims priority pursuant to 35 U.S.C. § 119 from Japanese patent application number 2021-139387 filed on Aug. 27, 2021, the entire disclosure of which is hereby incorporated by reference herein.

BACKGROUND

Technical Field

The present disclosure relates to a semiconductor module.

Description of the Related Art

Semiconductor modules each including a transistor and a protection circuit that protects the transistor from an overcurrent (see Japanese Patent No. 2523678, for example) are known.

Such a typical protection circuit turns off a transistor in response to an overcurrent flowing through the transistor to protect the transistor. However, the protection circuit may erroneously turn off the transistor, based on a current transiently flowing through the transistor, and/or the like, upon turning on of the transistor, for example.

SUMMARY

An aspect of an embodiment of the present disclosure is a semiconductor module that receives a power supply voltage and an input signal to thereby drive a load, the semiconductor module comprising: a first transistor having a control electrode, the first transistor being coupled to a first line in the semiconductor module, the first line being configured to receive the power supply voltage; a second transistor having a control electrode, the second transistor being coupled to the first line in parallel with the first transistor; a driver circuit configured to apply, to a second line in the semiconductor module, a first voltage to turn on the first transistor and the second transistor in response to the input signal; a first resistor having a first end coupled to the second line, and a second end coupled to the control electrode of the second transistor; a second resistor having a first end coupled to the second end of the first resistor, and a second end coupled to the control electrode of the first transistor; a third resistor which is coupled to the second transistor, and across which a second voltage corresponding to a current flowing through the second transistor is generated; a third transistor having a control electrode configured to receive the second voltage, the third transistor being coupled to the second end of the second resistor; and a terminal coupled to the first to third transistors, the third resistor, and the load, such that the load receives a current from the first transistor through the terminal.

Note that not all of the necessary features of the present disclosure are listed in the above summary. Moreover, sub-combinations of these features can be the disclosure as well.

BRIEF DESCRIPTION OF THE DRAWINGS

FIG. 1 illustrates an example of a configuration of a semiconductor module 10a.

FIG. 3 illustrates an example cross-sectional view of a diode 27 mounted to a semiconductor module 10a.

DETAILED DESCRIPTION

Hereinafter, the present disclosure will be described through embodiments of the disclosure. However, the following embodiments do not limit the disclosure according to the scope of the claims. Also, not all the combinations of the features described in the embodiments are necessarily essentials for solution in the disclosure.

Herein, when the term "couple" is used, it means to "electrically couple" unless otherwise noted. Herein, a state where the logic level of a voltage or a signal is a low (Lo) level will be referred to as "low or low level", and a state where the logic level is a high (Hi) level will be referred to as "high or high level".

Herein, one side in a direction parallel to the depth direction of a semiconductor module will be referred to as "front" or "upper" side, while the other side will be referred to as "back" or "lower" side. Further, the two main surfaces of a substrate, a layer, or another member will be referred to as "front surface" and "back surface". The directions such as "front" or "upper" side and "back" or "lower" side are not limited to the direction of gravity or the directions in which members are mounted to a substrate or the like at the time of mounting the semiconductor module.

Herein, a ground potential is a reference potential obtained by a configuration of an entire system including the semiconductor module, and is 0 V.

Embodiment 1

Example Configuration of Semiconductor Module 10a

Figure 1:
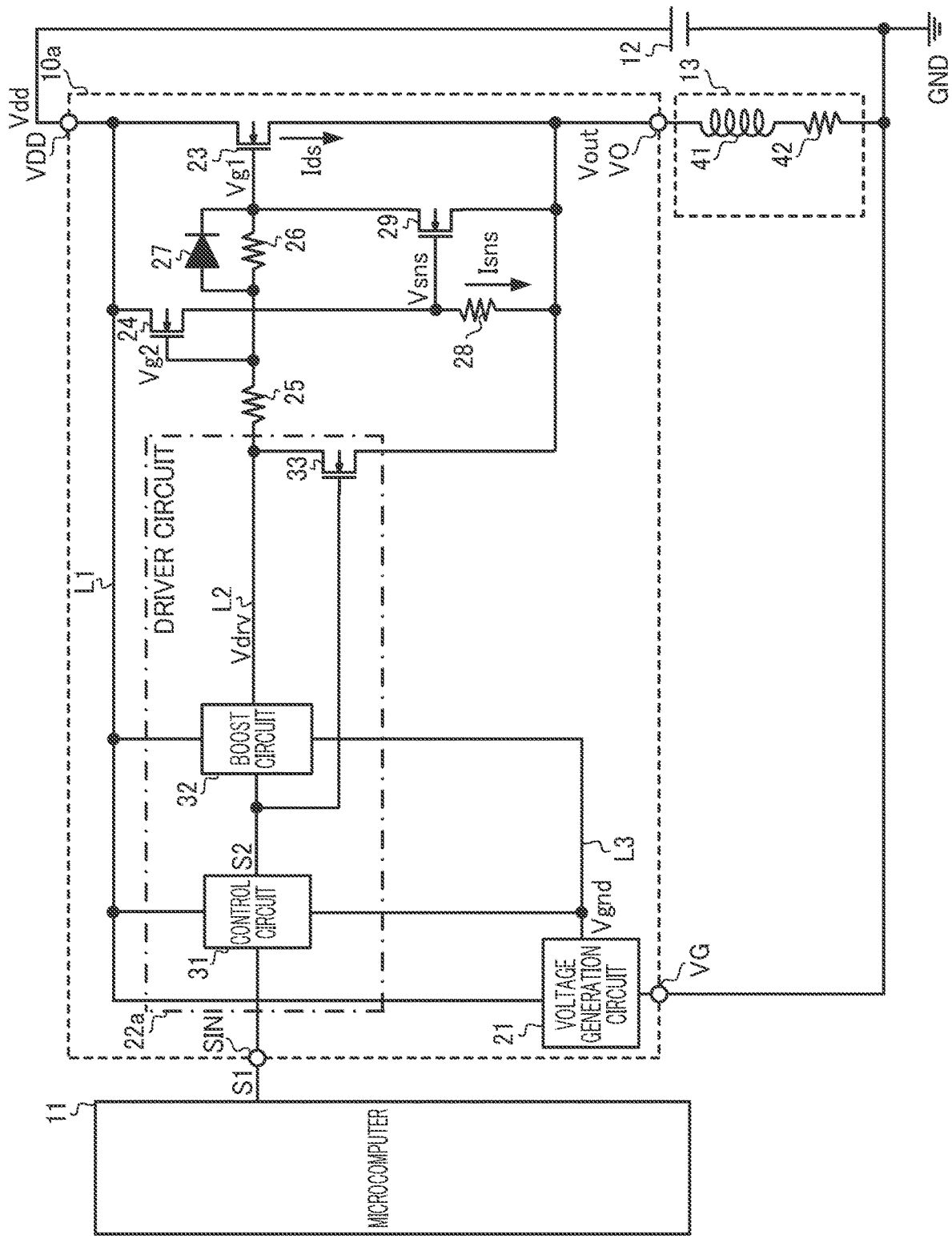

FIG. 1 illustrates an example of a configuration of a semiconductor module 10a. The semiconductor module 10a is an intelligent power switch (IPS) that drives a load 13 in response to a signal S1 input from a microcomputer 11. The semiconductor module 10a is provided on a side closer to a power supply 12, in other words, a high side with respect to the load 13, such that the semiconductor module 10a can drive the load 13 using a power supply voltage Vdd supplied from the power supply 12.

The microcomputer 11 outputs the signal S1 to a terminal SIN of the semiconductor module 10a. As an example, the microcomputer 11 is included in an electronic control unit (ECU) of an automobile.

The power supply 12 applies the power supply voltage Vdd to a terminal VDD of the semiconductor module 10a. The terminal VDD is coupled to a line L1 in the semiconductor module 10a, to thereby apply the power supply voltage Vdd to the line L1. As an example, the power supply 12 is a battery of an automobile.

As an example, the load 13 is a solenoid valve used in a transmission system of an automatic transmission automobile. A solenoid valve includes a solenoid constituting an electromagnet and a valve (not illustrated), and the valve is closed when the solenoid is electrically connected and the valve is open when the solenoid is not electrically connected. The load 13 includes an inductor 41 and a resistor 42.

The inductor 41 is the solenoid of the solenoid valve, as an example. The resistor 42 adjusts a voltage applied to the inductor 41. The resistor 42 is provided between the inductor 41 and the ground.

Example Configuration of Semiconductor Module 10a

The semiconductor module 10a includes a voltage generation circuit 21, a driver circuit 22a, metal-oxide-semiconductor (MOS) transistors 23, 24, and 29, terminals SIN, VDD, VG, and VO, resistors 25, 26, and 28, and a diode 27.

==Voltage Generation Circuit 21==

The voltage generation circuit 21 generates a voltage Vgnd serving as a voltage on the ground side of the driver circuit 22a, and applies the voltage Vgnd to a line L3. The voltage Vgnd is lower than the power supply voltage Vdd by a predetermined voltage (e.g., 5 V). The voltage generation circuit 21 is provided between the line L1 that receives the power supply voltage Vdd, and the terminal VG that is grounded.

==Overview of Driver Circuit 22a==

The driver circuit 22a applies, to a line L2, a voltage Vdrv to turn on the MOS transistors 23 and 24 in response to the signal S1 input thereto.

For example, the driver circuit 22a applies, to the line L2, the voltage Vdrv to turn on the MOS transistor 23, when the signal S1 is high, and applies, to the line L2, the voltage Vdrv to turn off the MOS transistor 23, when the signal S1 is low.

==MOS Transistor 23==

The MOS transistor 23 is turned on and off based on the voltage Vdrv, and supplies a voltage Vout and a current Ids to the load 13. As will be described later in detail, when the MOS transistor 29 is off, the voltage Vdrv is applied to a control electrode of the MOS transistor 23.

The MOS transistor 23 is an N type MOS transistor with a vertical trench structure (VMOS transistor) having a drain electrode formed in the back surface of a substrate and a source electrode formed in the front surface. The MOS transistor 23 according to an embodiment of the present disclosure is a power semiconductor device having a withstand voltage of several tens of V (e.g., having an on-resistance of 100 mΩ).

However, the MOS transistor 23 is not limited to a VMOS transistor and may be a planar MOS transistor or a bipolar device such as an insulated gate bipolar transistor (IGBT).

The MOS transistor 23 has a gate electrode coupled to the line L2 through the resistors 25 and 26, and a source electrode coupled to the terminal VO. Further, the MOS transistor 23 has a drain electrode coupled to the line L1 that receives the power supply voltage Vdd. Accordingly, the current Ids flowing through the MOS transistor 23 is supplied to the load 13 through the terminal VO. Note that the gate electrode of the MOS transistor 23 corresponds to "control electrode".

The MOS transistors 23 and 29, the resistor 28, and the load 13 that receives the current Ids from the MOS transistor 23, are coupled to the terminal VO.

==MOS Transistor 24==

The MOS transistor 24 is a sense MOS transistor through which a current Isns corresponding to the current Ids flowing through the MOS transistor 23 flows. Thus, the drain electrode of the MOS transistor 23 and the drain electrode of the MOS transistor 24 are coupled in parallel with the line L1.

The MOS transistor 24 is structurally similar to the MOS transistor 23. Moreover, the MOS transistor 24 is designed to allow, for example, a current Isns being 0.25% of the current Ids to flow therethrough such that the current Isns will be a current corresponding 0.1 to 1% of the current Ids.

==Resistors 25 and 26==

The resistors 25 and 26 are to lower the voltages at the gate electrodes of the MOS transistors 23 and 24 to reduce the current Ids flowing through the MOS transistor 23 when the current Ids increases. As will be described later in detail, in an embodiment of the present disclosure, the resistors 25 and 26 divide the voltage Vdrv to be applied to the MOS transistor 23 when the MOS transistor 29 is on. The voltages obtained by dividing the voltage Vdrv with the resistors 25 and 26 are applied to the control electrodes of the MOS transistors 23 and 24.

As an example, the resistor 25 has a resistance R1 and the resistor 26 has a resistance R2. In this case, assuming that a current Ig flows through the line L2, a voltage of Vg2=Vdrv−R1*Ig is applied to the control electrode of the MOS transistor 24, and a voltage of Vg1=Vdrv−Vg2−R2*Ig is applied to the control electrode of the MOS transistor 23.

As such, the resistors 25 and 26 adjust the ratio between the voltage Vg1 applied to the control electrode of the MOS transistor 23 and the voltage Vg2 applied to the control electrode of the MOS transistor 24 when the MOS transistor 29 is on. In particular, the resistances of the resistors 25 and 26 are set to adjust the voltage Vg1 such that the current Ids flowing through the MOS transistor 23 will be equal to or smaller than a current value Ioc1 which will be described later.

The resistor 25 has one end coupled to the line L2, and the other end coupled to the control electrode of the MOS transistor 24. Further, the resistor 26 has one end coupled to the resistor 25 on the side thereof coupled to the MOS transistor 24, and the other end coupled to the control electrode of the MOS transistor 23.

==Diode 27==

The diode 27 maintains the potential difference between the voltage Vg2 applied to the control electrode of the MOS transistor 24 and the voltage Vg1 applied to the control electrode of the MOS transistor 23 at a certain value or smaller when the voltage Vdrv is applied to the line L2.

The diode 27 has an anode coupled to the resistor 25, and a cathode coupled to the control electrode of the MOS transistor 23. In other words, the diode 27 is provided in a parallel with the resistor 26.

Accordingly, when the voltage applied to the diode 27 is about to exceed the forward voltage of the diode 27, a voltage for reducing the potential difference between the voltages Vg1 and Vg2 small is applied through the path via the diode 27 in priority to the path via the resistor 26. That is, with the provision of the diode 27, the potential difference between the voltages Vg1 and Vg2 is maintained at the forward voltage of the diode 27 or lower.

The MOS transistor 23 is larger in size than the MOS transistor 24, as mentioned above. Accordingly, in response to the driver circuit 22a outputting the voltage Vdrv to turn on the MOS transistors 23 and 24, there will be a difference between the voltage Vg2 at the MOS transistor 24 and the voltage Vg1 at the MOS transistor 23. Without the diode 27, the difference between the voltages Vg2 and Vg1 will increase, and such a state may continue in which the MOS transistor 23 is not turned on even if the MOS transistor 24 is turned on.

However, in an embodiment of the present disclosure, the diode 27 is provided, to thereby maintain the potential difference between the voltages Vg1 and Vg2 at a certain value or smaller. This can avoid a state in which the MOS transistor 23 is not turned on for a long time even if the MOS transistor 24 is turned on.

There is, however, a case where the potential difference between the voltages Vg1 and Vg2 does not increase, for example, when the driver circuit 22a has a high driving capability and the parasitic resistance and capacitance of the control electrodes of the MOS transistors 23 and 24 are low. In such a case, the MOS transistors 23 and 24 are turned on at similar timings, and thus the diode 27 can be omitted.

==Resistor 28==

The resistor 28 is a resistor (e.g., 20Ω) for detecting an overcurrent state of the MOS transistor 23, and is coupled between the MOS transistor 24 and the terminal VO. A voltage Vsns corresponding to the current Isns is generated across the resistor 28. As will be described later in detail, "the MOS transistor 23 being in an overcurrent state" means a state where the current value of the current Ids of the MOS transistor 23 is a predetermined value or greater.

==MOS Transistor 29==

The MOS transistor 29 is turned on according to the voltage Vsns when the MOS transistor 23 is brought about an overcurrent state, to thereby adjust the voltages Vg1 and Vg2.

The control electrode of the MOS transistor 29 is coupled to a node at which the MOS transistor 24 and the resistor 28 are coupled. Thus, the voltage Vsns is generated at the control electrode of the MOS transistor 29. In response to the voltage Vsns rising and exceeding the threshold voltage of the MOS transistor 29, the MOS transistor 29 is turned on.

The drain electrode of the MOS transistor 29 is coupled to the other end of the resistor 26. Upon turning on of the MOS transistor 29, the current output from the driver circuit 22a flows, through the line L2, the resistors 25 and 26, the MOS transistor 29, and the terminal VO, to the load 13. This lowers the voltage Vg1 applied to the control electrode of the MOS transistor 23 and the voltage Vg2 applied to the control electrode of the MOS transistor 24.

Accordingly, upon turning on of the MOS transistor 29, the current Ids of the MOS transistor 23 and the current Isns flowing through the MOS transistor 24 decrease.

With a decrease in the current Isns of the MOS transistor 24, the voltage Vsns drops, and thus the gate voltage at the MOS transistor 29 drops. As a result, the current flowing through the MOS transistor 29 decreases. This gradually weakens the effect of the MOS transistor 29 of lowering the voltages Vg1 and Vg2 and reducing the currents Ids and Isns.

By virtue of the above, the voltages Vg1, Vg2, and Vsns and the currents Ids and Isns gradually approach certain values. In this case, the current Ids approaches the current Ioc1 which will be described later.

As such, the resistors 25 and 26 and the MOS transistor 29 according to an embodiment of the present disclosure can lower the voltages Vg1 and Vg2 when the MOS transistor 23 is brought about an overcurrent state. Thus, in an embodiment of the present disclosure, it is possible to prevent the currents Ids and Isns from exceeding a certain value (current loci).

<<Details of Driver Circuit 22a>>

The driver circuit 22a includes a control circuit 31, a boost circuit 32, and a MOS transistor 33.

===Control Circuit 31===

The control circuit 31 outputs a signal S2 in response to the signal S1 input thereto. When the input signal S1 is high, the control circuit 31 outputs a low signal S2. On the other hand, when the signal S1 is low, the control circuit 31 outputs a high signal S2.

===Boost Circuit 32===

The boost circuit 32 boosts the power supply voltage Vdd in response to the logic level of the signal S2 input thereto, to apply the voltage Vdrv to the line L2. In an embodiment of the present disclosure, the boost circuit 32 boosts the power supply voltage Vdd when the signal S2 is low. On the other hand, the boost circuit 32 stops boosting the power supply voltage Vdd when the signal S2 is high.

In other words, the boost circuit 32 boosts the power supply voltage Vdd in response to the low signal S2 to turn on the MOS transistors 23 and 24, to apply the voltage Vdrv to the line L2.

===MOS Transistor 33===

The MOS transistor 33 is an interrupting device to turn off the MOS transistor 23 in response to the logic level of the signal S2 input to the MOS transistor 33.

In an embodiment of the present disclosure, the MOS transistor 33 is turned on when the signal S2 is high. Accordingly, a current flows from the line L2 to the terminal VO through the MOS transistor 33. At this time, the MOS transistor 33 lowers the voltage Vdrv applied to the line L2, to thereby lower the voltages Vg1 and Vg2. This turns off the MOS transistors 23 and 24.

On the other hand, when the signal S2 is low, the MOS transistor 33 is turned off. In this case, the voltage Vdrv is applied to the line L2 from the boost circuit 32. Note that, in an embodiment of the present disclosure, the NMOS transistor 33 is used as an interrupting device to turn off the N type MOS transistors 23 and 24, but the interrupting device is not limited thereto, and may be, for example, a bipolar transistor or the like.

The signal S1 corresponds to an "input signal", and the voltage Vdrv corresponds to a "first voltage". The signal S2 corresponds to a "driving signal". The MOS transistor 23 corresponds to a "first transistor", the MOS transistor 24 corresponds to a "second transistor", and the MOS transistor 29 corresponds to a "third transistor".

The resistor 25 corresponds to a "first resistor", and the resistor 26 corresponds to a "second resistor". The resistor 28 corresponds to a "third resistor". The voltage Vsns corresponds to a "second voltage". The current value Ioc1 corresponds to a "first current value".

The line L1 corresponds to a "first line", and the line L2 corresponds to a "second line".

<<Configuration of Boost Circuit 32>>

Figure 2:
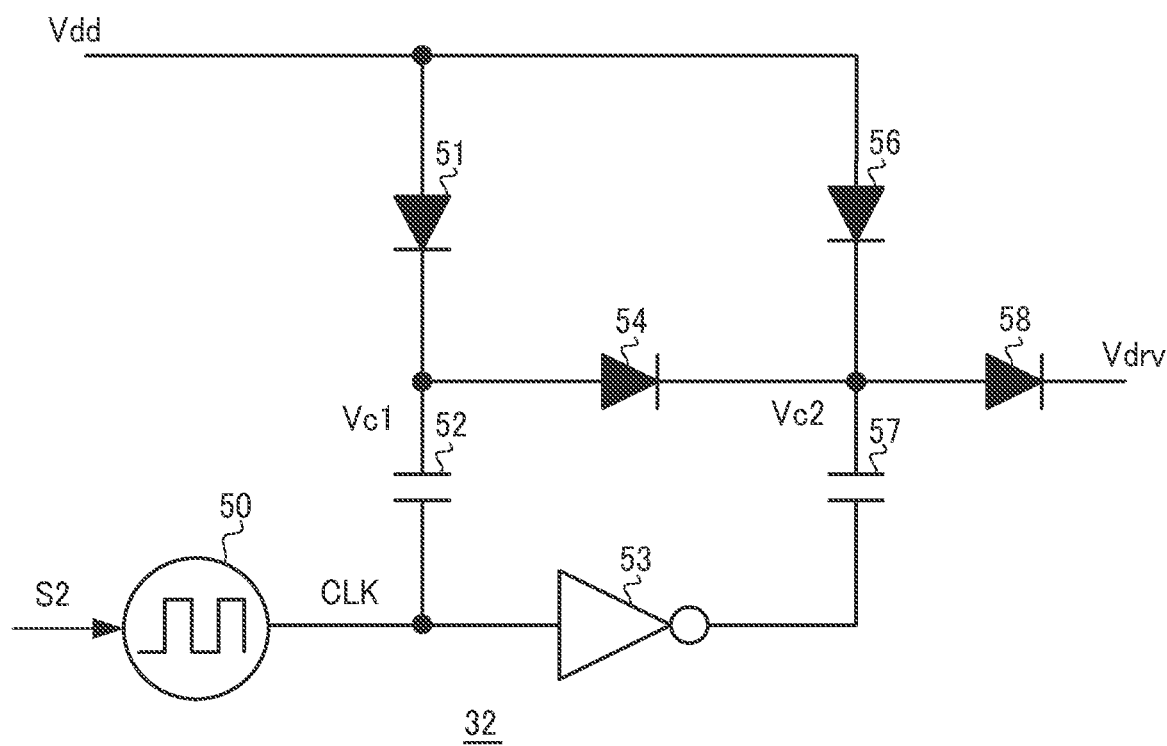
FIG. 2 illustrates an example of a configuration of a boost circuit 32.

FIG. 2 illustrates an example of a configuration of the boost circuit 32. The boost circuit 32 is a so-called charge pump circuit, and includes an oscillator circuit 50, diodes 51, 54, 56, and 58, an inverter 53, and capacitors 52 and 57. The forward voltage of the diodes 51, 54, 56, and 58 is referred to as "Vf".

The oscillator circuit 50 outputs a clock signal CLK with a predetermined frequency in response to the signal S2 to turn on the MOS transistors 23 and 24. The oscillator circuit 50 outputs the clock signal CLK in response to the signal S2 going low, and stops outputting the clock signal CLK in response to the signal S2 going high. Note that the clock signal CLK changes between the voltage Vgnd (low level) and the power supply voltage Vdd (high level).

The diode 51 and the capacitor 52 configure a first-stage boost circuit in the charge pump circuit. The diode 51 has an anode that receives the power supply voltage Vdd, and a cathode coupled to one end of the capacitor 52. Further, the output of the oscillator circuit 50 is coupled to the other end of the capacitor 52.

The inverter 53, the diodes 54 and 56, and the capacitor 57 configure a second-stage boost circuit in the charge pump circuit. Note that the inverter 53 is coupled between Vgnd and Vdd.

The diode 54 has an anode coupled to the one end of the capacitor 52, and a cathode is coupled to one end of the capacitor 57. The diode 56 has an anode that receives the power supply voltage Vdd, and a cathode coupled to the one end of the capacitor 57. Further, the output of the inverter 53 is coupled to the other end of the capacitor 57.

A voltage Vc2 at the one end of the capacitor 57 of the second-stage boost circuit is output as the voltage Vdrv through the diode 58.

<<Operation of Boost Circuit 32>>

As mentioned above, the clock signal CLK changes between the voltage Vgnd (low level) and the power supply voltage Vdd (high level). However, the following description will be given assuming that the low level of the clock signal CLK is 0 V for convenience, because the expressions of the voltages at nodes in the boost circuit 32 will otherwise be complicated.

Firstly, when the clock signal CLK is low, a voltage Vc1 at the one end of the capacitor 52 is charged through the diode 51. Thus, the voltage Vc1 at the one end of the capacitor 52 is given by Equation (1).

$$Vc1 = Vdd - Vf \quad (1)$$

When the clock signal CLK goes high (is at the level of the power supply voltage Vdd), the voltage Vc1 at the one end of the capacitor 52 is given by Equation (2).

$$Vc1 = 2 \times Vdd - Vf \quad (2)$$

At this timing, the output of the inverter 53 is low, and thus the capacitor 57 is charged, and the voltage Vc2 at the capacitor 57 is given by Equation (3).

$$Vc2 = 2 \times Vdd - 2 \times Vf \quad (3)$$

Further, when the clock signal CLK goes high, the voltage Vc2 at the one end of the capacitor 57 is given by Equation (4).

$$Vc2 = 3 \times Vdd - 2 \times Vf \quad (4)$$

As a result, the voltage Vdrv output from the diode 58 is given by Equation (5).

$$Vc2 = 3 \times Vdd - 3 \times Vf \quad (5)$$

Note that the boost circuit 32 according to an embodiment of the present disclosure includes a two-stage boosting section but is not limited thereto. Any configuration may be employed as long as the voltage Vdrv is a voltage by which the MOS transistors 23 and 24 can be turned on and off.

<<Configuration of Diode 27>>

Figure 3:
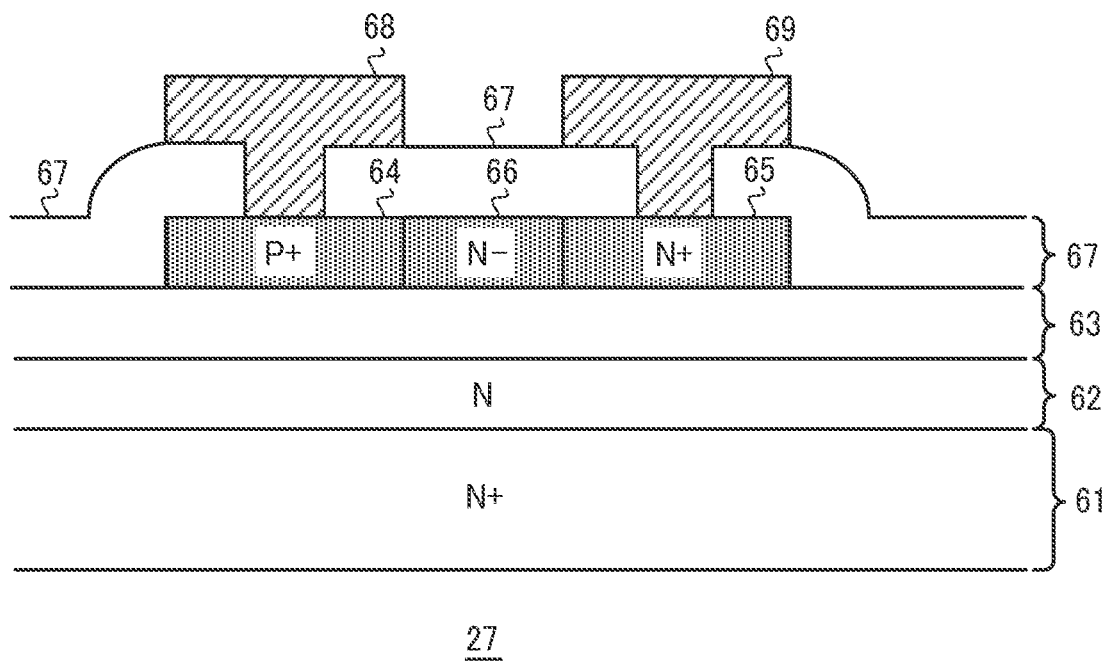

FIG. 3 illustrates an example cross-sectional view of the diode 27 mounted to the semiconductor module 10*a*. The diode 27 includes a substrate 61, an epitaxial layer 62, oxide films 63 and 67, dopant diffusion regions 64, 65, and 66, an anode 68, and a cathode 69.

Note that, as for terms of the regions attached with respective conductivity types, the symbol "+" means that the doping concentration is higher than that in the regions without "+", and the symbol "−" means that the doping concentration is lower than that in the regions without "−".

The substrate 61 according to an embodiment of the present disclosure is a substrate to which the MOS transistors 23 and 24 are provided. In other words, in an embodiment of the present disclosure, the MOS transistors 23 and 24 and the diode 27 are provided to the same semiconductor chip. The substrate 61 has an N+ conductivity type.

The epitaxial layer 62 is a layer provided on the upper side of the substrate 61. The epitaxial layer 62 is a layer provided by epitaxial growth on the substrate 61. The epitaxial layer 62 according to an embodiment of the present disclosure has an N conductivity type.

The oxide film 63 is provided to cover the upper side of the epitaxial layer 62. As an example, the oxide film 63 is a SiO2 film.

The dopant diffusion region 64 is a polysilicon region provided on the upper side of the oxide film 63. A P type dopant (e.g., boron (B)) is diffused in the dopant diffusion region 64. As an example, the dopant is diffused by ion implantation. The dopant diffusion region 64 according to an embodiment of the present disclosure has P+ conductivity type.

The dopant diffusion region 65 is a polysilicon region provided on the upper side of the oxide film 63. An N type dopant (e.g., phosphorus (P)) is diffused in the dopant diffusion region 65. As an example, the dopant is diffused by ion implantation. The dopant diffusion region 65 according to an embodiment of the present disclosure has N+ conductivity type.

The dopant diffusion region 66 is a region provided between and in contact with the dopant diffusion regions 64 and 65. The dopant diffusion region 66 according to an embodiment of the present disclosure corresponds to a depletion layer provided between the P+ type region and the N+ type region in the diode. Accordingly, the dopant diffusion region 66 according to an embodiment of the present disclosure has N-conductivity type whose doping concentration is lower than the N type doping concentration, which is the substrate concentration.

The oxide film 67 is provided on the upper side of the dopant diffusion regions 64 to 66 so as to cover them. As an example, the oxide film 67 is made of the same material as that of the oxide film 63.

The anode 68 is a terminal provided to and in contact with the upper surface of the dopant diffusion region 64. The anode 68 is provided after the dopant diffusion region 64 is exposed by etching the oxide film 67 provided on the upper side of the dopant diffusion region 64. As an example, the anode 68 is made of a metal (e.g., an aluminum-silicon alloy, hereinafter referred to as AlSi).

The cathode 69 is a terminal provided to and in contact with the upper surface of the dopant diffusion region 65. The cathode 69 is provided after the dopant diffusion region 65 is exposed by etching the oxide film 67 provided on the upper side of the dopant diffusion region 65. As an example, the cathode 69 is made of the same material as that of the anode 68. The cathode 69 according to an embodiment of the present disclosure is made of a metal (e.g., AlSi).

Note that the P conductivity type corresponds to a "first conductivity type", and the N conductivity type corresponds to a "second conductivity type". The dopant diffusion region 64 corresponds to a "first dopant diffusion region", and the dopant diffusion region 65 corresponds to a "second dopant diffusion region".

<<Timing Chart During Normal Operation of Semiconductor Module 10a>>

Figure 4:
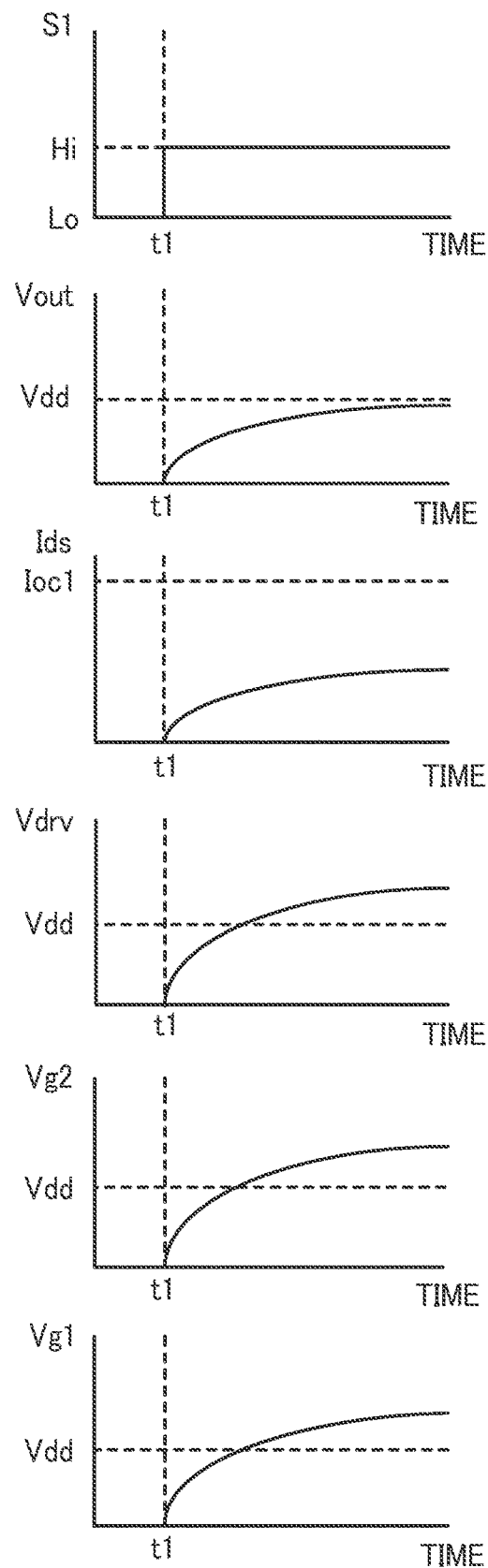
FIG. 4 illustrates an example of changes over time in a signal, voltages, and a current in a semiconductor module 10a during normal operation.

FIG. 4 illustrates an example of changes over time in a signal, voltages, and a current in the semiconductor module 10a during normal operation.

Note that, herein, "normal operation" of the semiconductor module 10a or a semiconductor module 10b which will be described later refers to a case in which there is no short-circuit or the like in the load 13 and the MOS transistor 23 is not in an overcurrent state. In particular, when the semiconductor modules 10a and 10b are in "normal operation", the drain-source current Ids flowing through the MOS transistor 23 has a current value smaller than a current value Ioc2 which will be described later.

FIG. 4 schematically illustrates the voltages and the signal assuming that a state in which the logic level thereof is low (Lo) is Lo and a state in which the logic level thereof is high (Hi) is Hi.

Until time t1, the microcomputer 11 outputs the low signal S1. At time t1, the microcomputer 11 changes the level of the signal S1 from low to high to turn on the MOS transistor 23.

In response to the signal S1 input to the driver circuit 22a being changed to high at time t1, the driver circuit 22a starts boosting the voltage Vdrv based on the power supply voltage Vdd. In response thereto, the voltage Vg1 applied to the control electrode of the MOS transistor 23 rises.

Then, the on-resistance of the MOS transistor 23 gradually decreases, which causes a rise in the voltage Vout applied to the terminal VO coupled to the MOS transistor 23. Upon turning on of the MOS transistor 23, the voltage Vout is to reach the power supply voltage Vdd. Accordingly, upon turning on of the MOS transistor 23, the voltage Vout gradually approaches the power supply voltage Vdd.

When the MOS transistor 23 is on, the current Ids flowing through the MOS transistor 23 increases. In an embodiment of the present disclosure, even when the current Ids flowing through the MOS transistor 23 increases, the current Ids is sufficiently smaller than the current value Ioc1 (e.g., equal to or smaller than 50% of the current value Ioc1 which indicates an overcurrent state).

When the current Ids flowing through the MOS transistor 23 is sufficiently smaller than the current value Ioc1, the current Isns flowing through the MOS transistor 24 and the voltage Vsns generated across the resistor 28, which is proportional to the current Isns, are small as well. In this case, the MOS transistor 29 is not turned on.

As such, during normal operation, the MOS transistor 29 is not turned on. Hence, in the line L2, the voltage Vg1 applied to the control electrode of the MOS transistor 23 and the voltage Vg2 applied to the control electrode of the MOS transistor 24 are equal to the voltage Vdrv. Accordingly, the MOS transistor 23 is driven by a desired voltage Vdrv.

<<Timing Chart when Overcurrent is Detected of Semiconductor Module 10a>>

Figure 5:
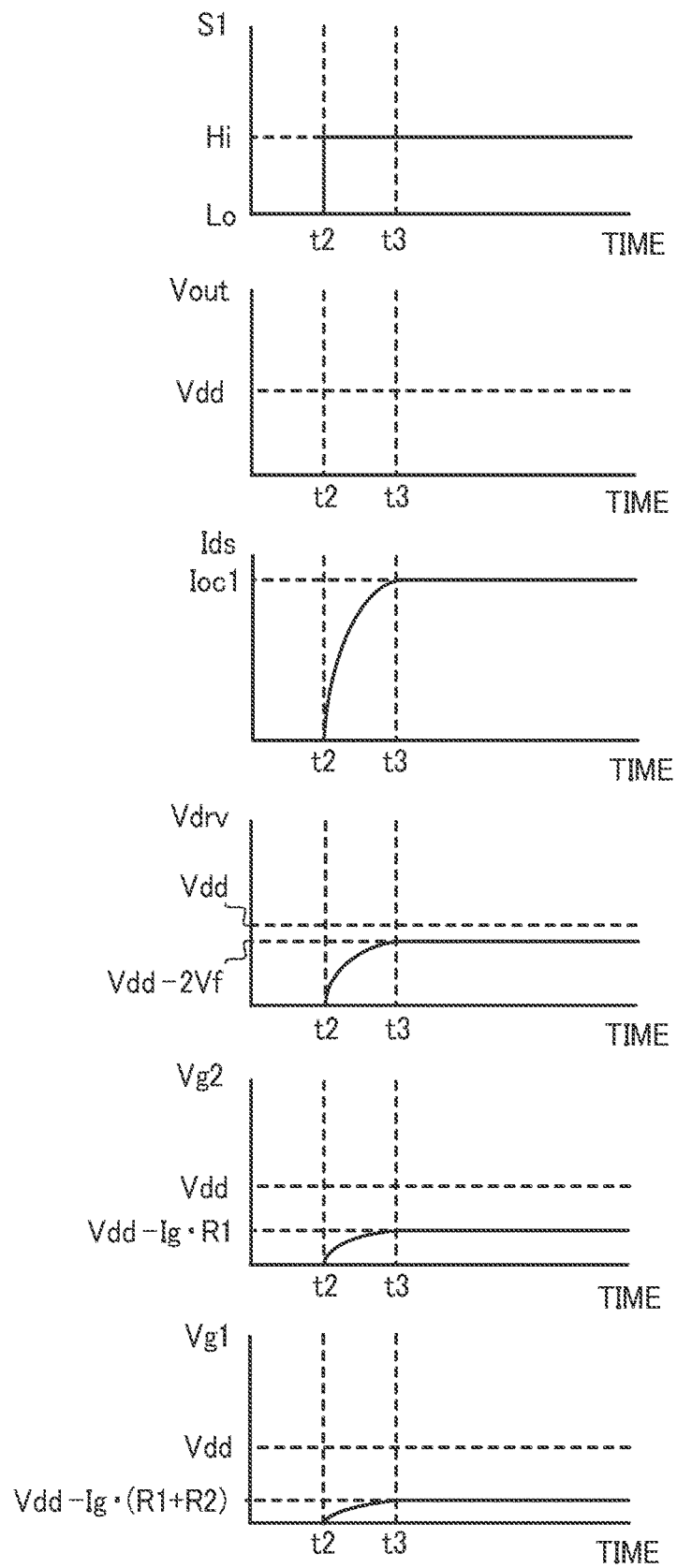
FIG. 5 illustrates an example of changes over time in a signal, voltages, and a current in a semiconductor module 10a during overcurrent detection.

FIG. 5 illustrates an example of changes over time in the signal, voltages, and current in the semiconductor module 10a during overcurrent detection. As mentioned earlier, in an embodiment of the present disclosure, an overcurrent state refers to a state in which the current Ids flowing through the MOS transistor 23 increases to the predetermined current value Ioc1.

Until time t2, the microcomputer 11 outputs the low signal S1. At time t2, the microcomputer 11 changes the level of the signal S1 from low to high to turn on the MOS transistor 23.

Note that, when an overcurrent occurs, for example, a path from the terminal VO to the ground is a short-circuited. In such a case, the resistance between the terminal VO and the ground is sufficiently lower than the on-resistance of the MOS transistor 23. Accordingly, the voltage Vout at the terminal VO hardly rises even when the MOS transistor 23 is turned on.

At time t2, the MOS transistor 23 is turned on, and the current Ids flowing through the MOS transistor 23 increases. With an increase in the current Ids, the current Isns flowing through the MOS transistor 24 also increases and the voltage Vsns rises as well.

Thus, upon approaching t3 (e.g., the timing at which the current Ids exceeds 50% of the current loci), the MOS transistor 29 is turned on. Upon turning on of the MOS transistor 29, a current flows from the boost circuit 32 through the line L2, the resistors 25 and 26, the MOS transistor 29, and the terminal VO. This slows the rise in the voltages Vg1 and Vg2.

Accordingly, increases in the current Ids flowing through the MOS transistor 23 and the current Isns flowing through the MOS transistor 24 are slowed as well. This also slows a rise in the voltage Vsns generated across the resistor 28 in proportion to the current Isns.

At time t3, the voltages Vg1, Vg2, and Vsns and the currents Ids and Isns are balanced and at constant values.

Further, at time t3, the current Ids flowing through the MOS transistor 23 reaches the current value Ioc1.

The voltage Vdrv applied to the line L2 by the driver circuit 22a gradually rises from time t2. At time t3, the driver circuit 22a applies the voltage Vdrv having reached a constant value Vdd−2Vf to the line L2.

Upon turning on of the MOS transistor 29, the voltage Vdrv output from the driver circuit 22a is divided by the resistors 25 and 26. The voltage Vg2 applied to the control electrode of the MOS transistor 24 starts rising from time t2, and is at a constant value Vdd−Ig×R1 from time t3.

Similarly, the voltage Vg1 applied to the control electrode of the MOS transistor 23 starts rising from time t2, and is at a constant value Vdd−Ig×(R1+R2) from time t3.

As has been described above, when a voltage Vsns higher than a voltage for tuning on the MOS transistor 29 is generated across the resistor 28, the current Ids flowing through the MOS transistor 23 is adjusted to the current Ioc1, such that a current equal to or smaller than the current Ioc1 flows therethrough.

The voltage Vsns is proportional to the current Isns flowing through the MOS transistor 24, and the current Isns is proportional to the current Ids flowing through the MOS transistor 23.

In other words, in the semiconductor module 10a, when a path other than the load 13 between the terminal VO and the ground is short-circuited such that the current Ids flowing through the MOS transistor 23 increases to cause an overcurrent state, the MOS transistor 29 is turned on to adjust the current Ids to or below the current value Ioc1.

This enables the semiconductor module 10a to limit the current when an overcurrent is caused by a short-circuit of the load and/or the like, to thereby appropriately protect the device.

Embodiment 2

<<Example Configuration of Semiconductor Module 10b>>

Figure 6:
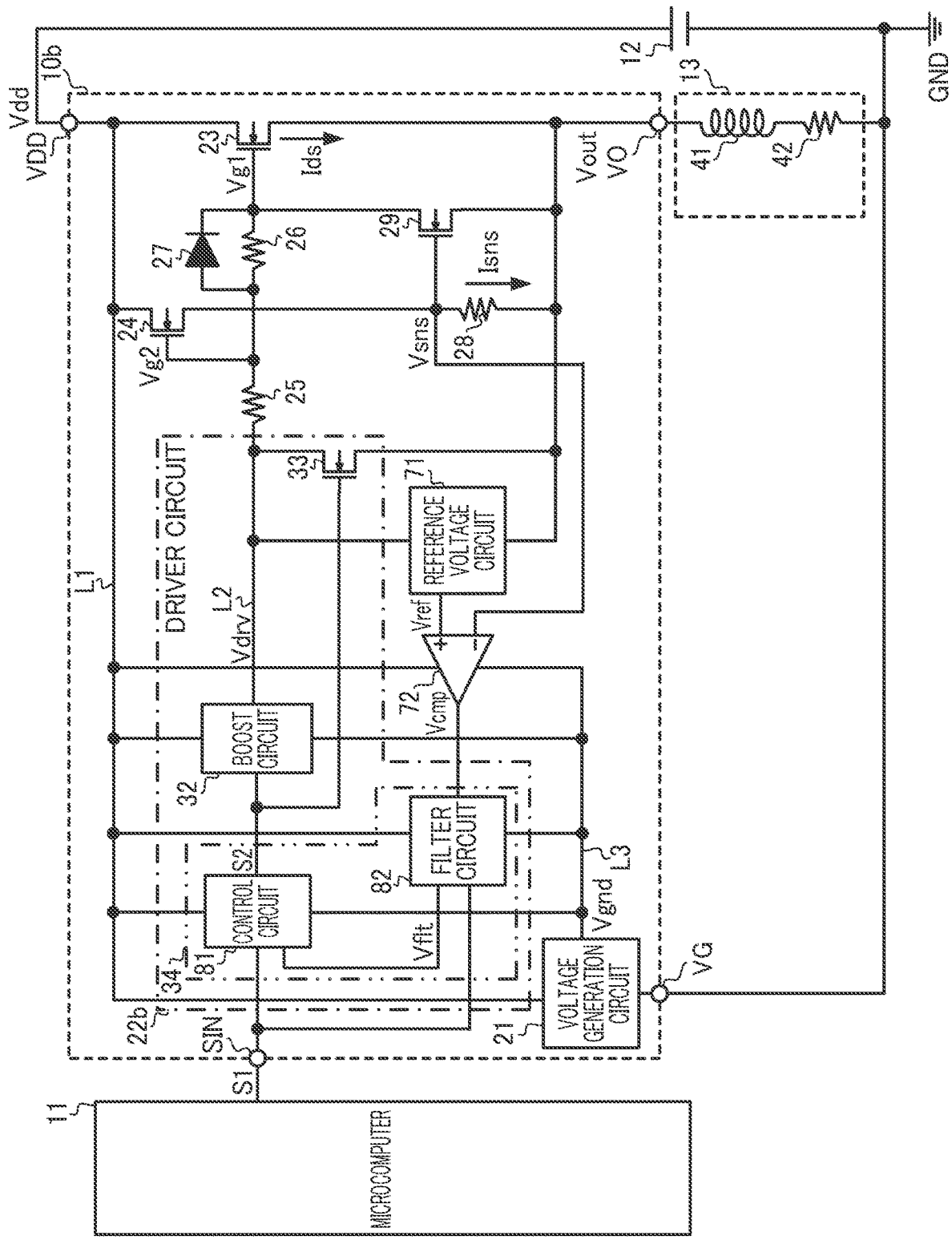
FIG. 6 illustrates an example of a configuration of a semiconductor module 10b.

FIG. 6 illustrates an example of a configuration of a semiconductor module 10b. The components that are the same between FIGS. 1 and 6 are given the same reference numerals. Accordingly, differences between the semiconductor modules 10a and 10b will be mainly described below.

The semiconductor module 10b differs from the semiconductor module 10a in that the semiconductor module 10b includes a driver circuit 22b, a reference voltage circuit 71, and a determination circuit 72.

<<Reference Voltage Circuit 71>>

The reference voltage circuit 71 generates a predetermined reference voltage Vref serving as a reference for the determination circuit 72 to detect an overcurrent, to apply the reference voltage Vref to one of lines coupled to the determination circuit 72.

The reference voltage Vref is set as a voltage with a certain potential difference (e.g., 100 mV) with respect to the voltage Vout generated at the terminal VO. For example, in the case where an overcurrent is detected when the resistor 28 has 20Ω and the current Ids flowing through the MOS transistor 23 is 2 A, and the current Isns under this condition is 5 mA, the reference voltage Vref is set to Vref=20×0.005 (V)=100 (mV).

==Determination Circuit 72==

The determination circuit 72 determines whether the MOS transistor 23 is in an overcurrent state based on a comparison between the voltage Vsns generated across the resistor 28 and the reference voltage Vref generated by the reference voltage circuit 71. The determination circuit 72 is a comparator that outputs a voltage Vcmp at a logic level that changes depending on the result of the determination.

In an embodiment of the present disclosure, the voltage Vcmp is input to a filter circuit 82 which will be described later.

Note that the determination circuit 72 determines that the MOS transistor 23 is in an overcurrent state, in response to the voltage Vsns reaching the voltage Vref. In this case, the current Ids flowing through the MOS transistor 23 reaches a current value Ioc2. In an embodiment of the present disclosure, the current value Ioc2 is set to be smaller than the current value Ioc1.

In other words, the voltage Vref according to an embodiment of the present disclosure is a voltage at which the current Ids flowing through the MOS transistor 23 is at the current value Ioc2 that is smaller than the current value Ioc1. In an embodiment of the present disclosure, the current value Ioc1 is a value for detecting whether the MOS transistor 23 is in an overcurrent state when the MOS transistor 23 is turned on.

The current value Ioc2, on the other hand, is a value for detecting whether the MOS transistor 23 is in an overcurrent state after turning on the MOS transistor 23. Generally, a larger current flows upon turning on of the MOS transistor 23 than after turning on of the MOS transistor 23. Accordingly, in an embodiment of the present disclosure, the current value Ioc2 after turning on of the MOS transistor 23 is set to be smaller than the current value Ioc1.

The reference voltage Vref is applied to one of the lines coupled to the determination circuit 72, and the voltage Vsns is applied to the other line coupled to the determination circuit 72. Both the voltages applied to these lines are low in a time period before the MOS transistors 23 and 24 are turned on in which the signal S1 is low. In this case, the determination circuit 72 according to an embodiment of the present disclosure outputs a low voltage Vcmp to the filter circuit 82.

Further, the determination circuit 72 according to an embodiment of the present disclosure is coupled to the line L1 and the voltage generation circuit 21, and a voltage corresponding to the difference between the power supply voltage Vdd and the voltage Vgnd is used as a bias voltage.

==Driver Circuit 22b==

The driver circuit 22b turns on and off the MOS transistor 23 in response to the signal S1 input thereto and the result of the determination by the determination circuit 72. Specifically, the driver circuit 22b according to an embodiment of the present disclosure turns on the MOS transistor 23, irrespective of the result of the determination by the determination circuit 72, in a filtering time period Tflt when the MOS transistor 23 is turned on, and turns off the MOS transistor 23 in response to the determination circuit 72 determining that the MOS transistor 23 is in an overcurrent state after a lapse of the filtering time period Tflt.

The driver circuit 22b includes the boost circuit 32, the MOS transistor 33, and a driving signal output circuit 34. The boost circuit 32 and the MOS transistor 33 operate in response to the signal S2, similarly to the boost circuit 32 and the MOS transistor 33 in the semiconductor module 10a. The driver circuit 22b differs from the driver circuit 22a in that the driver circuit 22b includes the driving signal output circuit 34.

===Driving Signal Output Circuit 34===

The driving signal output circuit 34 outputs the signal S2 to turn on and off the MOS transistor 23 in response to the signal S1 input thereto and the result of the determination by the determination circuit 72. The driving signal output circuit 34 includes a control circuit 81 and the filter circuit 82.

====Control Circuit 81====

The control circuit 81 outputs the signal S2 based on the logic level of the signal S1 input thereto and the logic level of a voltage Vflt input thereto from the filter circuit 82.

The control circuit 81 outputs the high signal S2 when the voltage Vflt input from the filter circuit 82 is low. On the other hand, the control circuit 81 outputs the low signal S2 when the voltage Vflt is high and the signal S1 is high, and outputs the high signal S2 when the voltage Vflt is high and the signal S1 is low.

===Filter Circuit 82===

The filter circuit 82 masks the operation of the control circuit 81, in the predetermined filtering time period Tflt (e.g., 10 μsec) when the MOS transistor 23 is turned on. Note that the "predetermined filtering time period Tflt when the MOS transistor 23 is turned on" refers to the time period from when the high signal S1 to turn on the MOS transistor 23 is input to the filter circuit 82 to when the filtering time period Tflt has elapsed.

Specifically, before the time period Tflt, the filter circuit 82 outputs the high voltage Vflt to the control circuit 81 in response to the low signal S1 input to the filter circuit 82. During the time period Tflt, the filter circuit 82 outputs the high voltage Vflt to the control circuit 81 irrespective of the result of the determination by the determination circuit 72. In this case, the control circuit 81 outputs the signal S2 in response to the signal S1. On the other hand, after a lapse of the time period Tflt, the filter circuit 82 outputs, to the control circuit 81, the voltage Vflt at the same logic level as the logic level of the voltage Vcmp input from the determination circuit 72.

Incidentally, there is a case where the determination circuit 72 instantaneously indicates a logic level representing that the MOS transistor 23 is in an overcurrent state in a time period from when the signal S1 is input to the control circuit 81 to when circuits in the semiconductor module 10b stabilize (e.g., several μsec). Thus, the filter circuit 82 masks the result of the determination determined by the determination circuit 72, thereby being able to stably drive the circuits.

Further, the filter circuit 82 according to an embodiment of the present disclosure is coupled to the terminal SIN. Accordingly, the signal S1 is input to the filter circuit 82, to thereby enable the filter circuit 82 to detect the timing at which the control circuit 81 starts an operation of turning on the MOS transistor 23.

In an embodiment of the present disclosure, the determination circuit 72 is coupled to the control circuit 81 through the filter circuit 82. Thus, by operating based on the voltage Vflt, the control circuit 81 can operate indirectly based on the voltage Vcmp without coupling the comparator circuit 72 to the control circuit 81.

==Filtering Time Period Tflt and Overcurrent Detection==

The semiconductor module 10b according to an embodiment of the present disclosure is in normal operation in a case (i) where the current Ids flowing through the MOS transistor 23 is smaller than both the current values Ioc1 and Ioc2.

In a case (ii) where a short-circuit occurs in the load in the filtering time period Tflt, the current Ids flowing through the MOS transistor 23 is limited to or below the current value Ioc1 by the resistors 25, 26, and 28 and the MOS transistors 24 and 29. In the case (ii), during the filtering time period Tflt, the determination circuit 72 does not perform determination based on the current Ioc2, and thus protection based on the current Ioc1 is performed.

In this case, after a lapse of the filtering time period Tflt, the determination circuit 72 determines that the MOS transistor 23 is in an overcurrent state, and the driver circuit 22b turns off the MOS transistor 23 based on the result of the determination.

In a case (iii) where the current Ids exceeds the current value Ioc2 after the filtering time period Tflt, the determination circuit 72 determines that the MOS transistor 23 has brought about an overcurrent state, and the driver circuit 22b turns off the MOS transistor 23 based on the result of the determination by the determination circuit 72.

As has been described above, the determination circuit 72 performs no determination during the filtering time period Tflt in order to prevent erroneous overcurrent detection while the semiconductor module 10b is in its rise time. On the other hand, in the case (ii), if the MOS transistor 23 is not protected from an overcurrent at all during the filtering time period Tflt, the device(s) in the circuit(s) may be damaged by an overcurrent in the filtering time period Tflt.

Accordingly, in the semiconductor module 10b, with the provision of the resistors 25 and 26, the MOS transistor 29, and the like, the drain-source current Ids of the MOS transistor 23 can be limited to or below the current value Ioc1 even during the filtering time period Tflt. This enables the semiconductor module 10b to protect the MOS transistor 23 from an overcurrent during the filtering time period Tflt as well. Details of the operation of the semiconductor module 10b during a normal operation and when an overcurrent is detected will be described below.

Note that the voltage Vref corresponds to a "third voltage". The current value Ioc2 corresponds to a "second current value".

<<Timing Chart During Normal Operation of Semiconductor Module 10b>>

Figure 7:
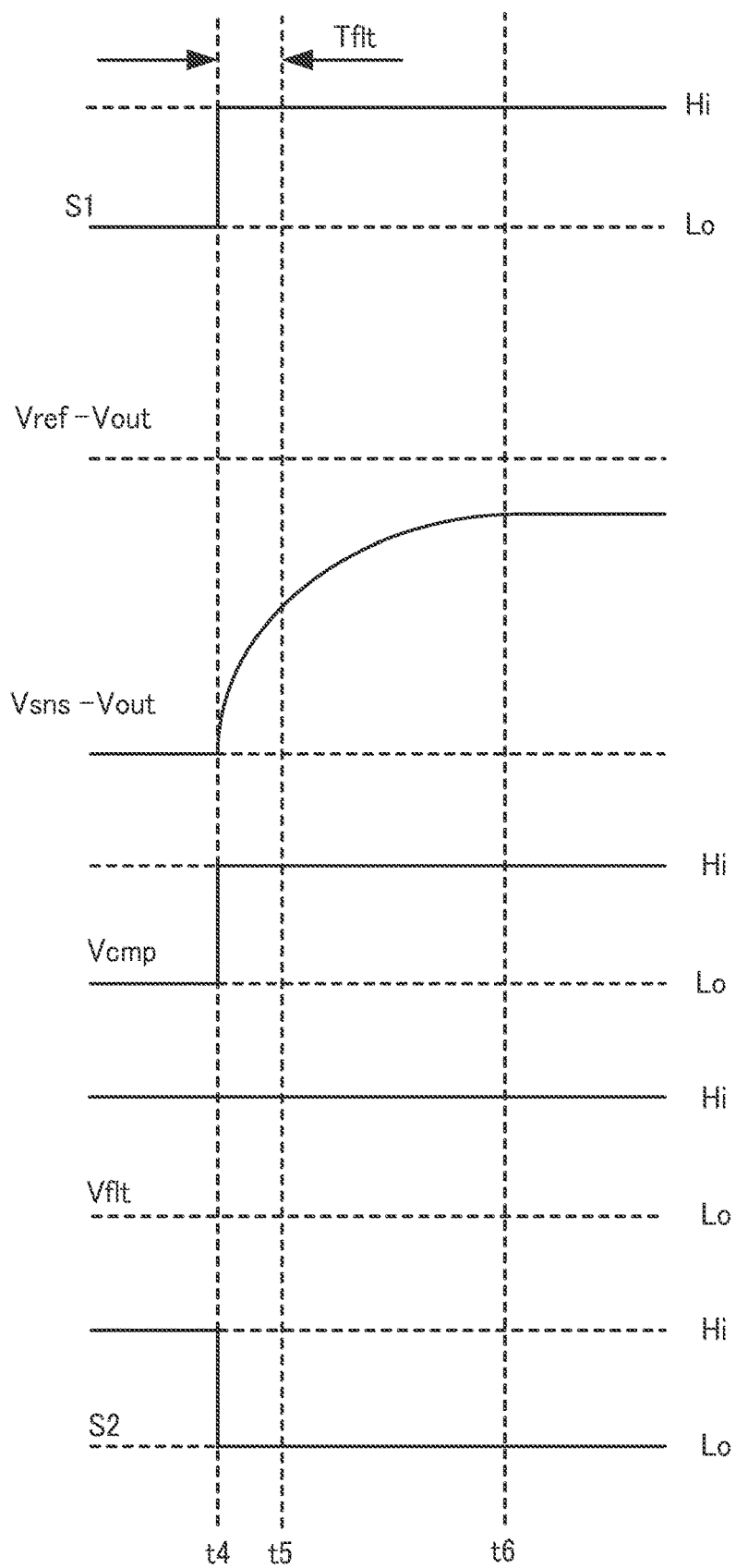
FIG. 7 illustrates an example of voltages and signals related to a driver circuit 22b and a determination circuit 72 during normal operation.

FIG. 7 illustrates an example of voltages and signals related to the driver circuit 22b and the determination circuit 72 during normal operation.

At time t4, to drive the MOS transistor 23, the microcomputer 11 changes the signal S1 input to the terminal SIN from low to high. Further, to continue driving the MOS transistor 23, the microcomputer 11 maintains the changed signal S1 at high level.

Upon turning on of the MOS transistor 23, the MOS transistor 24 is also turned on. This increases the drain-source current Isns of the MOS transistor 24. With an increase in the drain-source current Isns of the MOS transistor 24, the voltage Vsns generated across the resistor 28 rises as well.

Further, at time t6, the voltage Vsns is at a steady-state value. In an embodiment of the present disclosure, since the semiconductor module 10b is in normal operation, the voltage Vsns does not reach the reference voltage Vref, at or above which the MOS transistor 23 is brought about an overcurrent state.

The determination circuit 72 has one input terminal to receive the voltage Vsns and the other input terminal to receive the voltage Vref from the reference voltage circuit 71. In an embodiment of the present disclosure, when the semiconductor module 10b is in normal operation, the determination circuit 72 outputs a high voltage Vcmp.

Note that the determination circuit 72 is provided between the lines L1 and L3. Thus, the voltage Vcmp output from the determination circuit 72 being high means that the voltage Vcmp is at the power supply voltage Vdd. On the other hand, the voltage Vcmp being low means that the voltage Vcmp is at the voltage Vgnd.

The filter circuit 82 according to an embodiment of the present disclosure is coupled to the terminal SIN, such that the signal S1 is input to the filter circuit 82. Moreover, the voltage Vcmp is input to the filter circuit 82.

In a time period before time t4, the voltage of the line input to the determination circuit 72 from the reference voltage circuit 71 is low. Further, in this time period, the MOS transistor 24 is not turned on, and thus the voltage generated across the resistor 28 is also low and the voltage Vsns input to the line from the node between the MOS transistor 24 and the resistor 28 to the determination circuit 72 is low as well. In this case, the determination circuit 72 according to an embodiment of the present disclosure outputs the low voltage Vcmp.

On the other hand, in a time period after time t4, the voltage Vref is applied from the reference voltage circuit 71 to the corresponding line of the determination circuit 72. The semiconductor module 10b according to an embodiment of the present disclosure is in normal operation, such that the voltage Vsns does not reach the voltage Vref. Thus, in the time period after time t4, the determination circuit 72 outputs the high voltage Vcmp.

In response to the signal S1 changing from low to high at time t4, the filter circuit 82 masks the voltage Vcmp output from the determination circuit 72 from time t4 to time t5 at which the time period Tflt has elapsed.

Specifically, the filter circuit 82 outputs the high voltage Vflt to the control circuit 81 from time t4 to time t5 irrespective of the logic level of the voltage Vcmp. Accordingly, the logic level of the voltage Vcmp is masked with respect to the control circuit 81 from time t4 to time t5. In a time period after time t5, the filter circuit 82 outputs the voltage Vflt at the same logic level as that of the voltage Vcmp. In the time period before time t4, the filter circuit 82 outputs the high voltage Vflt in response to the low signal S1.

Note that the overcurrent detection of the semiconductor module 10b is performed by using the voltage Vsns corresponding to the current Isns flowing through the MOS transistor 24, whose on-time is shorter than that of the MOS transistor 23. Accordingly, the time period Tflt is set at a short time (e.g., 10 μsec).

The signal S1 is input to the control circuit 81 from the microcomputer 11 through the terminal SIN. In the time period before time t4, the low signal S1 is input to the control circuit 81, to turn off the MOS transistor 23. In response to the low signal S1, the control circuit 81 outputs the high signal S2. While the signal S2 is high, the boost circuit 32 does not boost the power supply voltage Vdd and the MOS transistor 33 is on.

When the signal S1 input to the control circuit 81 goes high at time t4 to turn on the MOS transistor 23, the control circuit 81 outputs the signal S2 changed from high to low. In response to the signal S2 going low, the boost circuit 32 boosts the power supply voltage Vdd to thereby start generating the driving voltage Vdrv and applies it to the MOS transistor 23. Further, the MOS transistor 33 is turned off.

In an embodiment of the present disclosure, the semiconductor module 10b is in normal operation, and an overcurrent state is not detected. Accordingly, in the time period after time t4, the control circuit 81 continues outputting the low signal S2 so as to maintain the MOS transistor 23 in the on state.

<<Timing Chart when Overcurrent is Detected in Semiconductor Module 10b>>

Figure 8:
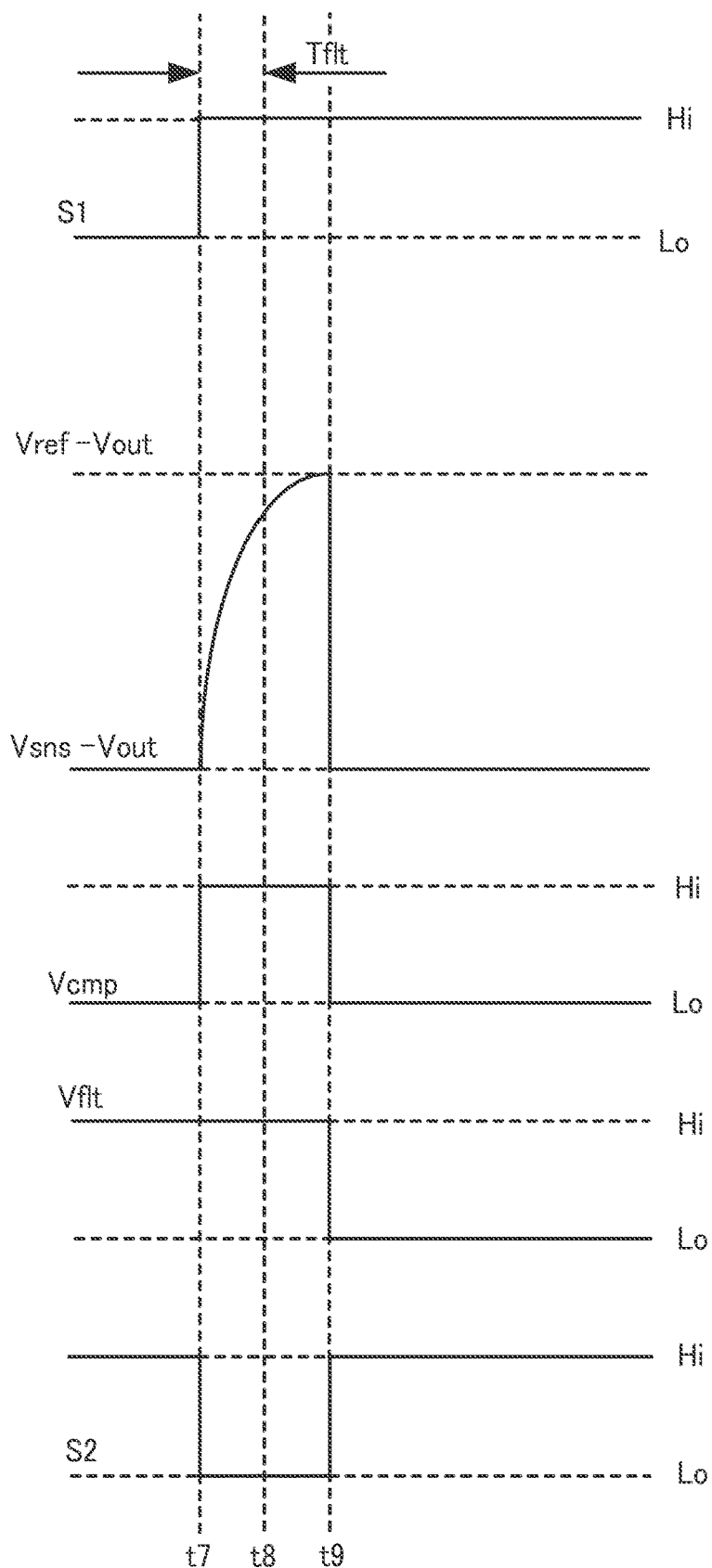
FIG. 8 illustrates an example of changes over time in signals and voltages in a semiconductor module 10b during overcurrent detection.

FIG. 8 illustrates an example of changes over time in voltages and signals in the semiconductor module 10b when an overcurrent is detected.

At time t7, similarly to the normal operation, the microcomputer 11 changes the signal S1 from low to high, to drive the MOS transistor 23. Further, the microcomputer 11 maintains the changed signal S1 at high level, to continue driving the MOS transistor 23.

At time t7, the MOS transistors 23 and 24 are turned on. In association therewith, the currents Ids and Isns of the MOS transistors 23 and 24 increase. In an embodiment of the present disclosure, the voltage Vsns rises with an increase in the current Isns and, in response to the voltage Vsns reaching the reference voltage Vref at time t9, the determination circuit 72 determines that the MOS transistor 23 is in an overcurrent state.

In response to the determination circuit 72 detecting the overcurrent state of the MOS transistor 23, the driver circuit 22b turns off the MOS transistor 23. In this case, the MOS transistor 24 is also turned off in association with turning off of the MOS transistor 23. Accordingly, the voltage Vsns generated across the resistor 28 drops after reaching the reference voltage Vref.

In an embodiment of the present disclosure, to protect the MOS transistor 23 from the overcurrent state, the driver circuit 22b turns off the MOS transistor 23 for a predetermined time period from time t9. In association therewith, the MOS transistor 24 is also turned off, and the voltage Vsns generated across the resistor 28 drops to be maintained at the value corresponding to the voltage Vout.

In a time period before time t7, both the voltage supplied to the line from the reference voltage circuit 71 to the determination circuit 72 and the voltage supplied to the line from the node between the MOS transistor 24 and the resistor 28 to the determination circuit 72 are low. In this case, the determination circuit 72 outputs the low voltage Vcmp.

In the time period from time t7 to time t9, the voltage Vref is supplied to the line from the reference voltage circuit 71 to the determination circuit 72, and the voltage Vsns generated across the resistor 28 is supplied to the line from the node between the MOS transistor 24 and the resistor 28 to the determination circuit 72, resulting in the voltage Vsns generated across the resistor 28 dropping below the reference voltage Vref. In this case, the determination circuit 72 outputs the high voltage Vcmp to the filter circuit 82.

On the other hand, at time t9, the voltage Vsns reaches the reference voltage Vref, and the determination circuit 72 determines that the MOS transistor 23 has brought about an overcurrent state. Thus, the determination circuit 72 outputs the low voltage Vcmp to the filter circuit 82. Moreover, the determination circuit 72 continues outputting the low voltage Vcmp for a predetermined time period from time t9.

In the time period before time t7, the filter circuit 82 outputs the high voltage Vflt in response to the low signal S1 input thereto.

In the time period Tflt from time t7 to time t8, the filter circuit 82 outputs the high voltage Vflt irrespective of the logic level of the voltage Vcmp. Accordingly, the logic level of the voltage Vcmp is masked with respect to the control circuit 81.

In an embodiment of the present disclosure, the determination circuit 72 outputs the high voltage Vcmp in the time period Tflt from time t7 to time t8. Even if the circuit operation in the semiconductor module 10b is unstable and thus the determination circuit 72 outputs the low voltage Vcmp in the time period from time t7 to time t8, the filter circuit 82 outputs the high voltage Vflt during this time period.

On the other hand, after time t8, the filter circuit 82 outputs, to the control circuit 81, the voltage Vflt at the same logic level as that of the voltage Vcmp.

Accordingly, in an embodiment of the present disclosure, the filter circuit 82 outputs the high voltage Vflt in the time period before time t7 and in the time period from time t7 to time t9. The filter circuit 82 outputs the low voltage Vflt in a predetermined time period from time t9.

In the time period before time t7, the low signal S1 is input to the control circuit 81, to turn off the MOS transistor 23. In response to the low signal S1, the control circuit 81 outputs the high signal S2. While the signal S2 is high, the boost circuit 32 does not boost the power supply voltage Vdd and the MOS transistor 33 is on.

In response to the signal S1 going high at time t7 to turn on the MOS transistor 23, the control circuit 81 outputs the signal S2 changed from high to low. In response to the signal S2 going low, the boost circuit 32 starts boosting the power supply voltage Vdd to generate the driving voltage Vdrv and applies the boosted voltage Vdrv to the MOS transistor 23. Further, the MOS transistor 33 is turned off.

On the other hand, at time t9, the filter circuit 82 inputs the low voltage Vflt to the control circuit 81. This low voltage Vflt indicates, to the control circuit 81, that the MOS transistor 23 has brought about an overcurrent state.

Accordingly, in the time period after time t9, the control circuit 81 outputs the high signal S2 based on the low voltage Vflt input from the filter circuit 82. In response to the signal S2 going high, the boost circuit 32 stops boosting the power supply voltage Vdd, and the MOS transistor 33 is turned on, to thereby turn off the MOS transistor 23.

<<Relationships Among Voltages and Current in Time Period after Lapse of Time Period Tflt in Embodiment 2>>

Figure 9:
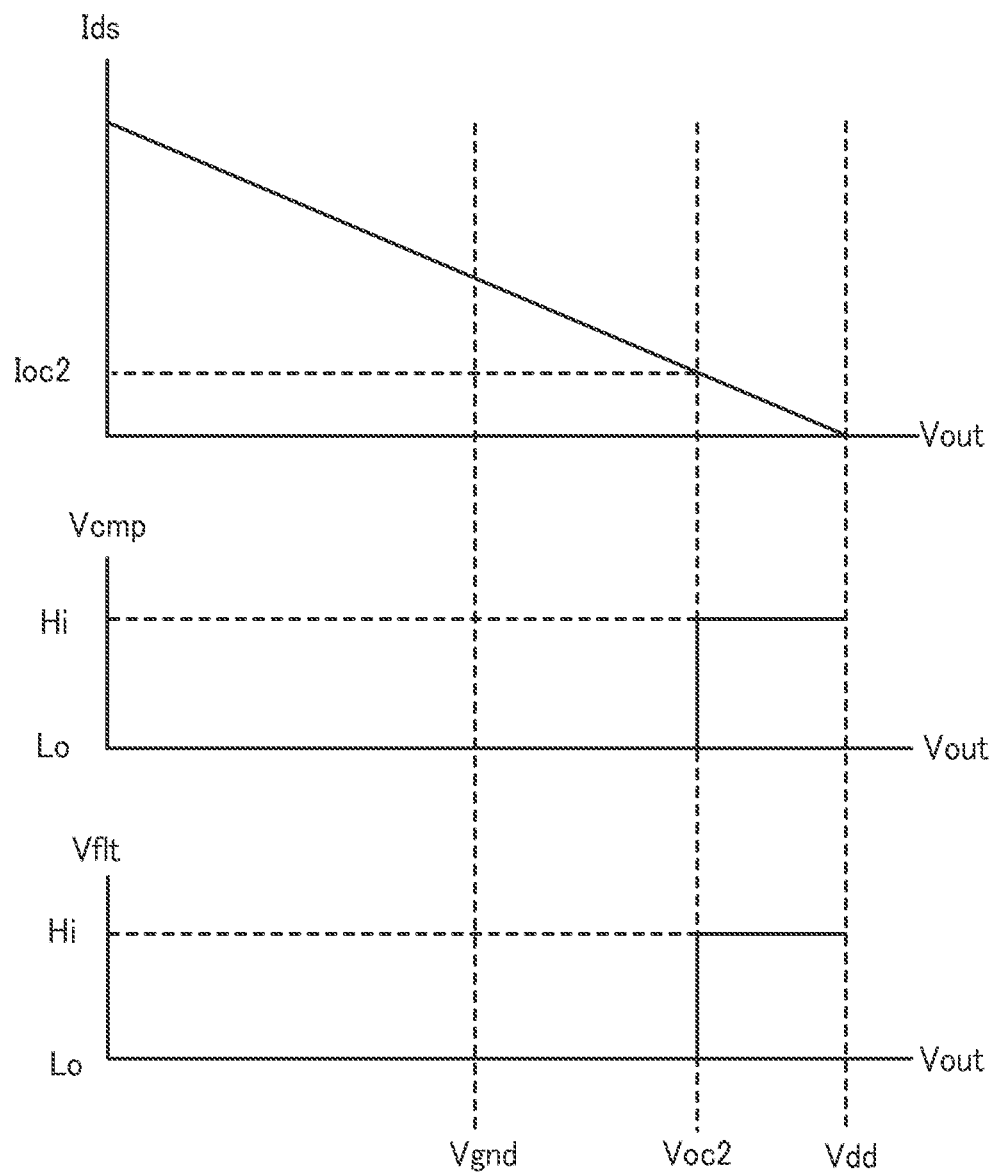
FIG. 9 illustrates a schematic example of a voltage Vout at a terminal VO, a current Ids, and a voltage Vcmp output from a determination circuit 72.

FIG. 9 illustrates a schematic example of the voltage Vout at the terminal VO, the current Ids, and the voltage Vcmp output from the determination circuit 72. FIG. 9 illustrates a graph representing a state where the MOS transistor 23 is on in a time period from when the signal S1 changes from low to high to when the time period Tflt has elapsed.

A relationship between the voltage Vout and the current Ids is illustrated. When the semiconductor module 10b is in normal operation and the MOS transistor 23 is on, the voltage Vout applied to the terminal VO is at the power supply voltage Vdd.

In the graph presented, when the drain-source current Ids of the MOS transistor 23 reaches the current Ioc2 indicating an overcurrent state (e.g., 2 A), the voltage Vout applied to the terminal VO reaches a voltage Voc2 indicating an overcurrent.

In an embodiment of the present disclosure, when the voltage Vout applied to the terminal VO reaches the voltage Voc2, the voltage Vsns generated across the resistor 28 reaches the reference voltage Vref output by the reference voltage circuit 71. In other words, the semiconductor module 10b is in normal operation when the voltage Vout applied to the terminal VO is in a range higher than the voltage Voc2 and equal to or lower than the power supply voltage Vdd.

The determination circuit 72 outputs the high voltage Vcmp when the voltage Vout is in a range higher than the voltage Voc2 and lower than the power supply voltage Vdd, in other words, when the voltage Vsns is in a range lower than the reference voltage Vref. On the other hand, the determination circuit 72 outputs the low voltage Vcmp when the voltage Vout is in a range lower than the voltage Voc2, that is, when the voltage Vsns is in a range higher than the reference voltage Vref.

The voltage Vflt is at the same logic level as that of the voltage Vcmp.

SUMMARY

The semiconductor modules 10a and 10b according to embodiments of the present disclosure have been described.

An embodiment of the present disclosure provides the semiconductor module 10a or 10b including: the MOS transistor 23 having a control electrode, the MOS transistor 23 being coupled to the line L1 configured to receive the power supply voltage Vdd; the MOS transistor 24 having a control electrode, the MOS transistor 24 being coupled to the line L1 in parallel with the MOS transistor 23; the driver circuit 22a or 22b configured to apply, to the line L2, the voltage Vdrv to turn on the MOS transistors 23 and 24 in response to the signal S1; the resistor 25 having one end coupled to the line L2 and the other end coupled to the control electrode of the MOS transistor 24; the resistor 26 having one end coupled to the other end of the resistor 25 and the other end coupled to the control electrode of the MOS transistor 23; the resistor 28, which is coupled to the MOS transistor 24 and across which the voltage Vsns corresponding to the current Isns flowing through the MOS transistor 24 is generated; the MOS transistor 29 having a control electrode configured to receive the voltage Vsns, the MOS transistor 29 being coupled to the other end of the resistor 26; and the terminal VO coupled to the MOS transistors 23, 24, and 29, the resistor 28, and the load 13 configured to receive the current Ids.

This makes it possible to limit the current Ids to or below the current Ioc1, when an overcurrent occurs at the MOS transistor 23 due to a short-circuit in a path other than the load 13 between the terminal VO and the ground, and a current Ids larger than a current for turning on the MOS transistor 29 flows.

Further, the semiconductor module 10a or 10b includes the diode 27 having an anode coupled to the resistor 25 and a cathode coupled to the control electrode of the MOS transistor 23.

This maintains the potential difference between the voltages Vg1 and Vg2 respectively applied to the control electrodes of the MOS transistors 23 and 24 at or below the forward voltage of the diode 27, to thereby stabilize the operation when the semiconductor module 10a or 10b is turned on.

The semiconductor module 10a or 10b further includes: the substrate 61 provided with the MOS transistors 23 and 24; and the oxide film 63 provided on the upper side of the substrate 61, and the diode 27 includes the P+ type dopant diffusion region 64 provided on the upper side of the oxide film 63, and the N+ dopant diffusion region 65 provided on the upper side of the oxide film 63 and coupled to the dopant diffusion region 64.

As such, in the semiconductor module 10a or 10b, the oxide film 63 is provided on the upper side of the substrate 61. This enables the diode 27 to be mounted to the same semiconductor chip as the semiconductor chip to which the MOS transistors 23 and 24 and the like are mounted.

The semiconductor module 10b further includes: the reference voltage circuit 71 configured to generate the predetermined voltage Vref; and the determination circuit 72 configured to determine whether the MOS transistor 23 is in an overcurrent state based on a comparison between the voltages Vsns and Vref, wherein the driver circuit 22b turns on and off the MOS transistor 23 in response to the signal S1 and the result of the determination by the determination circuit 72.

This can reliably protect the device from an overcurrent with respect to a short-circuit of the load in the semiconductor module 10b.

Further, the resistors 25 and 26 have resistances with which the current Ids flowing through the MOS transistor 23 has a value equal to or smaller than the current value Ioc1, and the voltage Vref is a voltage at which the current Ids flowing through the MOS transistor 23 is at the current value Ioc2 that is smaller than the current value Ioc1.

In other words, in the semiconductor module 10b according to an embodiment of the present disclosure, the current value Ioc2, based on which overcurrent protection is performed by the determination circuit 72, is smaller than the current value Ioc1, based on which overcurrent limitation is performed with the resistors 25 and 26, the MOS transistor 29, and the like. Accordingly, in the semiconductor module 10b, it is possible to protect the device from an overcurrent, by performing protection based on the current value Ioc2 in a time period in which the determination circuit 72 can perform overcurrent protection, and by limiting the current Ids to or below the current Ioc1 in a time period in which the determination circuit 72 cannot perform the protection.

Further, the driver circuit 22b turns on the MOS transistor 23, irrespective of the result of the determination by the determination circuit 72, to be on in the predetermined time period Tflt when the MOS transistor 23 is turned on, and turns off the MOS transistor 23 in response to the determination circuit 72 determining that the MOS transistor is in an overcurrent state, after a lapse of the predetermined time period Tflt.

In other words, the semiconductor module 10b performs overcurrent protection to turn off the MOS transistor 23 in response to the current value Ids exceeding the current Ioc1 in a time period other than the time period Tflt, and performs overcurrent protection to limit the current Ids flowing through the MOS transistor 23 to or below the current Ioc1 during the time period Tflt.

This enables the semiconductor module 10b to protect the MOS transistor 23 from an overcurrent during the filtering time period Tflt as well.

The driver circuit 22b includes the driving signal output circuit 34 configured to output the signal S2 to turn on and off the MOS transistor 23, in response to the signal S1 and the result of the determination by the determination circuit 72; the boost circuit 32 configured to boost the power supply voltage Vdd in response to the signal S2 to turn on the MOS transistor 23, and apply the voltage Vdrv to the line L2; and the MOS transistor 33 configured to lower the voltage Vdrv of the line L2, in response to the signal S2 to turn off the MOS transistor 23.

As such, the semiconductor module 10b includes the boost circuit 32 and the MOS transistor 33 that are configured to operate in response to the signal S2, to be able to appropriately supply the voltage Vdrv to turn on and off the MOS transistor 23.

The present disclosure is directed to provision of a semiconductor module capable of limiting a current flowing through a transistor.

It is possible to provide a semiconductor module capable of limiting a current flowing through a transistor.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

It should be noted that the processes such as the operations, procedures, steps, stages, and the like performed by the device, system, program, and method described in the scope of the claims, description, and figures can be executed in any order, as long as the order is not particularly and clearly indicated by "before," "prior to," and/or the like, and as long as the output from a previous process is not used in a subsequent process. Even if an operation flow is described by using term(s) such as "first", "next", and/or the like for convenience in the scope of the claims, description, and/or figures, this does not necessarily mean that the process must be performed in this order.

What is claimed is:

1. A semiconductor module that receives a power supply voltage and an input signal to thereby drive a load, the semiconductor module comprising:
   a first transistor having a control electrode, the first transistor being coupled to a first line in the semiconductor module, the first line being configured to receive the power supply voltage;
   a second transistor having a control electrode, the second transistor being coupled to the first line in parallel with the first transistor;
   a driver circuit configured to apply, to a second line in the semiconductor module, a first voltage to turn on the first transistor and the second transistor in response to the input signal;
   a first resistor having a first end directly coupled to the second line, and a second end directly coupled to the control electrode of the second transistor;
   a second resistor having a first end coupled to the second end of the first resistor, and a second end coupled to the control electrode of the first transistor;
   a diode connected in parallel to the second resistor, with an anode thereof coupled to the first end of the second resistor and a cathode thereof coupled to the second end of the second resistor;
   a third resistor which is coupled to the second transistor, and across which a second voltage corresponding to a current flowing through the second transistor is generated;
   a third transistor having a control electrode configured to receive the second voltage, the third transistor being directly coupled to the second end of the second resistor; and
   a terminal coupled to the first to third transistors, the third resistor, and the load, such that the load receives a current from the first transistor through the terminal.

2. The semiconductor module according to claim 1, further comprising:
   a substrate on which the diode, the first transistor, and the second transistor are formed; and
   an oxide film provided on an upper side of the substrate, wherein
   the diode includes a first dopant diffusion region of a first conductivity type provided on an upper side of the oxide film, and a second dopant diffusion region of a second conductivity type provided on the upper side of the oxide film, the second dopant diffusion region being coupled to the first dopant diffusion region.

3. The semiconductor module according to claim 1, further comprising:
   a reference voltage circuit configured to generate a third voltage that is a predetermined reference voltage; and
   a determination circuit configured to determine whether the first transistor is in an overcurrent state based on a comparison between the second voltage and the third voltage, wherein
   the driver circuit turns on and off the first transistor in response to the input signal and a result of a determination by the determination circuit.

4. The semiconductor module according to claim 3, wherein
   the first and second resistors are so configured that a current flowing through the first transistor has a value equal to or smaller than a first current value, and
   the third voltage is a voltage at which the current flowing through the first transistor is at a second current value that is smaller than the first current value.

5. The semiconductor module according to claim 3, wherein the driver circuit
   turns on the first transistor, irrespective of the result of the determination by the determination circuit, during a predetermined time period, and
   turns off the first transistor in response to the determination circuit determining that the first transistor is in the overcurrent state after a lapse of the predetermined time period.

6. The semiconductor module according to claim 3, wherein the driver circuit includes:
   a driving signal output circuit configured to output a driving signal to turn on and off the first transistor, in response to the input signal and the result of the determination by the determination circuit;

a boost circuit configured to boost the power supply voltage in response to the driving signal to turn on the first transistor, and to apply the first voltage to the second line; and an interrupting device configured to lower the first voltage of the second line, in response to the driving signal to turn off the first transistor.

* * * * *